United States Patent
Wang et al.

(10) Patent No.: US 9,924,254 B2
(45) Date of Patent: Mar. 20, 2018

(54) TO DETECT THE AMBIENT TEMPERATURE AROUND THE MEMS MICROPHONE

(71) Applicants: Kai Wang, Shenzhen (CN); Hu Chen, Shenzhen (CN); Guojun Liu, Shenzhen (CN)

(72) Inventors: Kai Wang, Shenzhen (CN); Hu Chen, Shenzhen (CN); Guojun Liu, Shenzhen (CN)

(73) Assignee: AAC TECHNOLOGIES PTE. LTD., Singapore (SG)

( * ) Notice: Subject to any disclaimer, the term of this patent is extended or adjusted under 35 U.S.C. 154(b) by 0 days.

(21) Appl. No.: 15/416,744

(22) Filed: Jan. 26, 2017

(65) Prior Publication Data

US 2017/0339477 A1 Nov. 23, 2017

(30) Foreign Application Priority Data

May 17, 2016 (CN) .................... 2016 2 0449660 U

(51) Int. Cl.
| | | |
|---|---|---|
| H04R 1/04 | (2006.01) | |
| H04R 29/00 | (2006.01) | |
| B81B 7/00 | (2006.01) | |
| H04R 19/04 | (2006.01) | |

(52) U.S. Cl.
CPC ............. *H04R 1/04* (2013.01); *B81B 7/0087* (2013.01); *H04R 29/004* (2013.01); *B81B 2201/0257* (2013.01); *B81B 2207/012* (2013.01); *H04R 19/04* (2013.01); *H04R 2201/003* (2013.01)

(58) Field of Classification Search
CPC ........ H04R 19/005; H04R 19/04; H04R 1/04; H04R 17/02; H04R 19/016; H04R 1/406; H04R 1/222; H04R 1/342; H04R 29/004; H04R 11/04; H04R 21/02; H04R 2410/00; H04R 9/08; H04R 1/1041; H04R 1/326
See application file for complete search history.

(56) References Cited

U.S. PATENT DOCUMENTS

| | | | |
|---|---|---|---|
| 2004/0159776 A1* | 8/2004 | Richard ........... | H03K 19/00369 250/214 R |
| 2012/0269363 A1* | 10/2012 | Suvanto ................... | H04R 1/04 381/107 |
| 2013/0129133 A1* | 5/2013 | Inoda ..................... | H04R 19/04 381/337 |
| 2013/0264610 A1* | 10/2013 | Chen ..................... | B81C 1/0023 257/252 |
| 2014/0205128 A1* | 7/2014 | Spoettl ................... | H04R 31/00 381/369 |
| 2014/0226836 A1* | 8/2014 | Miyatake ............. | H04R 1/1083 381/94.1 |

(Continued)

*Primary Examiner* — Mohammad Islam
(74) *Attorney, Agent, or Firm* — Na Xu; IPro, PLLC

(57) ABSTRACT

A MEMS microphone is disclosed. The MEMS microphone includes an encapsulation structure provided with an accommodation space; a MEMS chip for detecting sound signal accommodated in the accommodation space; an ASIC chip received in the accommodation space. The ASIC chip includes a signal processing module connected to MEMS chip for processing the sound signal detected by the MEMS chip and outputting the processed sound signal. The MEMS microphone further includes a temperature detection module for detecting temperature signal and outputting the temperature signal.

5 Claims, 2 Drawing Sheets

(56) References Cited

U.S. PATENT DOCUMENTS

| | | | |
|---|---|---|---|
| 2015/0158722 A1* | 6/2015 | Lim | B81B 7/02 |
| | | | 257/416 |
| 2015/0228265 A1* | 8/2015 | Muza | G10K 11/002 |
| | | | 381/71.7 |
| 2017/0041692 A1* | 2/2017 | Watson | H04R 1/023 |

* cited by examiner

TO DETECT THE AMBIENT TEMPERATURE AROUND THE MEMS MICROPHONE

FIELD OF THE INVENTION

The present invention relates to a MEMS microphone, especially to a kind of MEMS microphone with temperature detection function.

DESCRIPTION OF RELATED ART

The existing MEMS microphone has sound detection function, but the existing MEMS microphone can't detect the ambient temperature around the MEMS microphone.

Therefore, it is necessary to provide a kind of new technology solution to overcome above disadvantage.

BRIEF DESCRIPTION OF THE DRAWINGS

Many aspects of the embodiment can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EXEMPLARY EMBODIMENT

The present invention will hereinafter be described in detail with reference to an exemplary embodiment. To make the technical problems to be solved, technical solutions and beneficial effects of present disclosure more apparent, the present disclosure is described in further detail together with the figures and the embodiment. It should be understood the specific embodiment described hereby is only to explain this disclosure, not intended to limit this disclosure.

Figure 1:
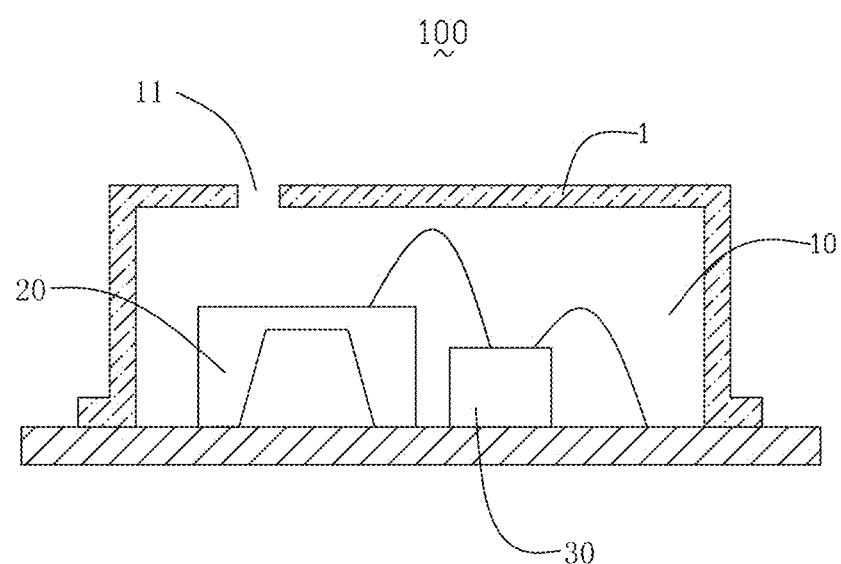
FIG. 1 is a cross-sectional view of a MEMS microphone in accordance with an exemplary embodiment of the present disclosure.
Figure 2:
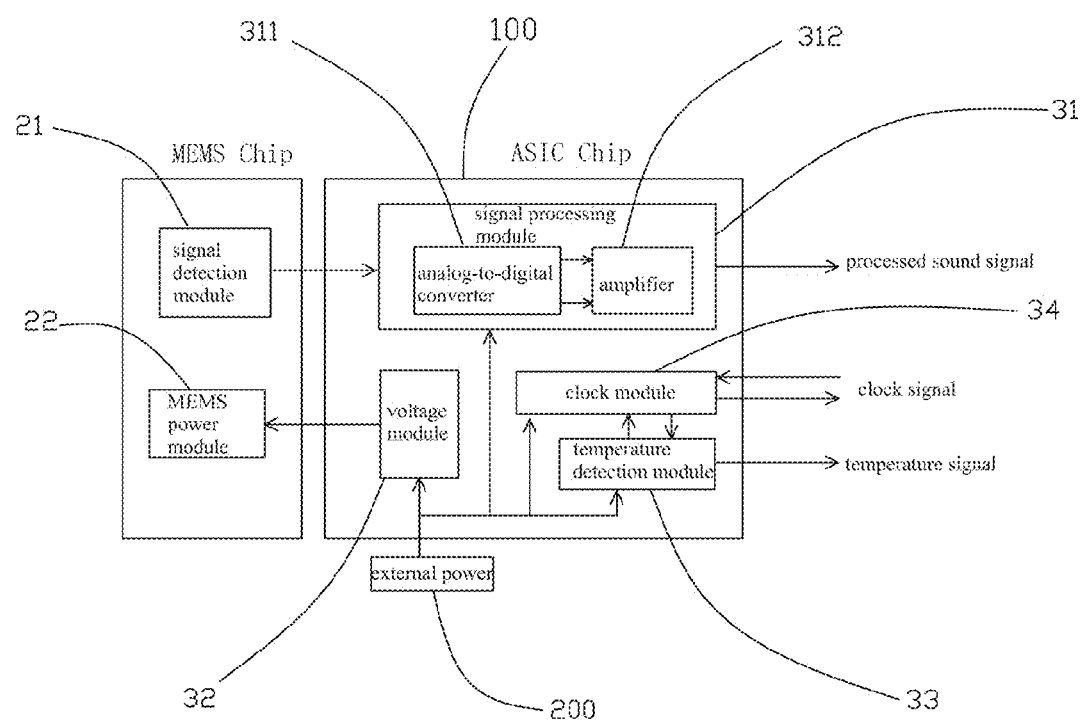
FIG. 2 is an illustrative module diagram of the MEMS microphone in FIG. 1.

Referring to FIGS. 1-2, a MEMS microphone 100, in accordance with an exemplary embodiment of the present disclosure, is connected to an external power 200. The MEMS microphone 100 comprises an encapsulation structure 1 with an accommodation space 10, a MEMS chip 20 and an ASIC chip 30 with several circuit modules set in the accommodation space, and an air hole 11 set in the encapsulation structure 1. The air hole 11 can be set above or under the encapsulation structure 1.

The MEMS chip 20 includes a signal detection module 21 and a MEMS power module 22, and the signal detection module 21 is used for detecting sound signal, and the sound signal is differential analog signal. The signal detection module 21 transits the differential analog signal to the ASIC chip 30.

The circuit module on the ASIC chip 30 includes a signal processing module 31 connected to the signal detection module 21 on the MEMS chip 20, a voltage module 32 that provides drive voltage for the MEMS power module 22 on the MEMS chip 20, a temperature detection module 33 that is used for detecting ambient temperature and outputting the ambient temperature and a clock module 34 connected to the temperature detection module 33. The signal processing module 31 includes an analog-to-digital converter 311 that converts the analog signal to digital signal and an amplifier 312 that amplifies the digital signal, and the voltage module 32 provides the constant voltage that drives the MEMS power module, and the clock module 34 controls whether the temperature detection module 33 outputs temperature signal or not. The temperature detection module 33 is digital circuit module, by which the signal output is digital signal.

The external power 200 is connected to the signal processing module 31, the power module 32, the temperature detection module 33 and the clock module 34 on the ASIC chip 30 respectively, in order to drive each of above described circuit module.

Specifically, while sound signal is detected, the signal detection module 21 on the MEMS chip 20 transits the analog signal to the signal processing module 311, the analog-to-digital converter 311 on the signal processing module 311 converts the differential analog signal received into digital signal, and the amplifier 312 amplifies the above digital signal. The signal processing module 31 then outputs useful electric signal finally, i.e. sound signal that has been processed, meanwhile, the temperature detection module 33 detects temperature signal according to the current working environment, and transmits the signal to the clock module 34. The clock module 34 receives the external clock signal, and then the clock module 34 outputs the control signal to the temperature detection module 33. The temperature detection module 33 determines whether to output temperature signal or not based on the control signal, and the clock signal can be digital signal in various modes.

The temperature detection module is applied in the MEMS microphone, which makes the MEMS microphone detect its working ambient temperature in real time.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:
1. A MEMS microphone, comprising:
an encapsulation structure provided with an accommodation space;
a MEMS chip for detecting sound signal accommodated in the accommodation space, the MEMS chip including a MEMS power module;
an ASIC chip received in the accommodation space, the ASIC chip including a signal processing module connected to MEMS chip for processing the sound signal detected by the MEMS chip and outputting the processed sound signal; wherein
the MEMS microphone further includes a temperature detection module for detecting temperature signal and outputting the temperature signal, the ASIC chip includes a voltage module for providing drive voltage to the MEMS power module; wherein the temperature detection module is a digital circuit module; wherein, the ASIC chip further includes a clock module connected to the temperature detection module, and the clock module controls whether the temperature detection module outputs temperature signal or not.

2. The MEMS microphone as described in claim 1, wherein the MEMS chip includes a signal detection module for transmitting the sound signal to the signal processing module.

3. The MEMS microphone as described in claim 2, wherein the sound signal detected by the signal detection module is a differential analog signal.

4. The MEMS microphone as described in claim 3, wherein the signal processing module further includes an analog-to-digital converter that converts the differential analog signal to digital signal.

5. The MEMS microphone as described in claim 4, wherein the signal processing module further includes an amplifier that amplifies the digital signal.

* * * * *